United States Patent
Onishi et al.

(10) Patent No.: US 8,963,756 B2
(45) Date of Patent: Feb. 24, 2015

(54) D/A CONVERTER, PERIPHERAL DEVICE, AND PLC

(75) Inventors: Atsuko Onishi, Chiyoda-ku (JP); Yoshiyuki Kubota, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/876,299

(22) PCT Filed: Sep. 28, 2010

(86) PCT No.: PCT/JP2010/005806
§ 371 (c)(1),
(2), (4) Date: May 7, 2013

(87) PCT Pub. No.: WO2012/042556
PCT Pub. Date: Apr. 5, 2012

(65) Prior Publication Data
US 2013/0214954 A1 Aug. 22, 2013

(51) Int. Cl.
*H03M 1/66* (2006.01)
*G06F 1/03* (2006.01)

(52) U.S. Cl.
CPC .............. *H03M 1/66* (2013.01); *G06F 1/0321* (2013.01)
USPC .......................................... 341/144; 341/147

(58) Field of Classification Search
USPC .......................................... 341/144, 147, 157
See application file for complete search history.

(56) References Cited

U.S. PATENT DOCUMENTS

| 4,544,914 A | 10/1985 | Chan et al. |
| 4,992,792 A * | 2/1991 | Mori et al. ................... 341/147 |
| 5,200,751 A * | 4/1993 | Smith ............................ 341/147 |
| 5,784,019 A * | 7/1998 | Wong et al. .................. 341/141 |
| 7,970,935 B2 * | 6/2011 | Yanagihara ................... 709/244 |
| 2009/0267673 A1 | 10/2009 | Kamenicky et al. |
| 2010/0195840 A1 | 8/2010 | Ciccone |

FOREIGN PATENT DOCUMENTS

| JP | 6-152248 A | 5/1994 |
| JP | 8-222954 A | 8/1996 |
| JP | 2914100 B1 | 6/1999 |
| JP | 2008-5296 A | 1/2008 |
| TW | 200832355 A | 8/2008 |
| TW | 201008120 A1 | 2/2010 |

OTHER PUBLICATIONS

Notice of Reasons for Refusal, dated Apr. 2, 2013, JP Application No. 2012-53602.

(Continued)

*Primary Examiner* — Brian Young
(74) *Attorney, Agent, or Firm* — Sughrue Mion, PLLC; Richard C. Turner

(57) ABSTRACT

A D/A converter according to the present invention includes a wave-form data-array memory means for memorizing a wave-form data array configured of a plurality of digital values, a wave-form output-format data memory means for memorizing wave-form output-format data designating a wave-form output period, a digital value output means for sequentially reading out the digital values for each wave-form output period from the wave-form data-array memory means and outputting the values, and a D/A conversion means for converting the digital values outputted from the digital value output means into analog-data values.

9 Claims, 3 Drawing Sheets

(56) References Cited

OTHER PUBLICATIONS

Taiwanese Patent Office Action (Notice of the Opinion on Examination), dated Apr. 30, 2013, Taiwanese Application No. 99135510.
International Search Report for PCT/JP2010/005806 dated Nov. 2, 2010.
Office Action issued May 25, 2014 in Korean Patent Application No. 10-2013-7009753.
Communication dated Nov. 20, 2014 from the Korean Intellectual Property Office in counterpart Korean Patent Application No. 10-2013-7009753.

* cited by examiner

D/A CONVERTER, PERIPHERAL DEVICE, AND PLC

CROSS REFERENCE TO RELATED APPLICATIONS

This application is a National Stage of International Application No. PCT/JP2010/005806 filed Sep. 28, 2010, the contents of which are incorporated herein by reference in their entirety.

TECHNICAL FIELD

The present invention relates to a digital-to-analog (D/A) converter, a peripheral device, and a programmable logic controller (PLC) provided with the D/A converter.

BACKGROUND ART

A conventional D/A converter is known in which, when a digital value is entered thereinto from the outside thereof for every predetermined period, the digital value is sequentially converted into an analog value. However, even if the maximum D/A conversion speed of the D/A converter is very high, because the actual D/A conversion speed depends on the speed when the digital value is written thereinto from thereoutside, a problem has occurred that the actual D/A conversion speed decreases.

In Patent Document 1, a technology is disclosed for the purpose of resolving such a problem. In Patent Document 1, an analog signal processor for a programmable controller is disclosed which directly performs, based on an analog signal inputted from thereoutside, a series of actions from A/D conversion to D/A conversion without the intervention of a CPU device.

PRIOR ART DOCUMENTS

Patent Documents

[Patent Document 1]
Japanese Patent Publication No. 2,914,100 (for example, paragraph 0033, FIG. 4)

DISCLOSURE OF THE INVENTION

Problems to be Solved by the Invention

However, because the analog signal processor for the programmable controller in Patent Document 1 calculates a digital value whenever it performs the D/A conversion, a problem has occurred that it is difficult to make the D/A conversion speed sufficiently high.

Means for Solving the Problem

A D/A converter according to the present invention includes a wave-form data-array memory means for memorizing a wave-form data array configured of a plurality of digital values, a wave-form output-format data memory means for memorizing wave-form output-format data designating a wave-form output period, a digital value output means for sequentially reading out the digital values for each wave-form-output output from the wave-form data-array memory means and outputting the values, and a D/A conversion means for converting the digital values outputted from the digital value output means into analog-data values.

A peripheral device according to the present invention includes an input means, and a wave-form data-array support means for, based on an input from the input means, writing a wave-form data array configured of a plurality of digital values into the wave-form data-array memory means provided on a D/A converter as recited in any one of claims 1 to 6.

A PLC according to the present invention is characterized by including the D/A converter.

Advantageous Effect of the Invention

According to the present invention, utilizing the rapidity of the D/A converter, wave forms can be outputted at a high speed.

BEST MODE FOR CARRYING OUT THE INVENTION

Embodiment 1

Figure 1:
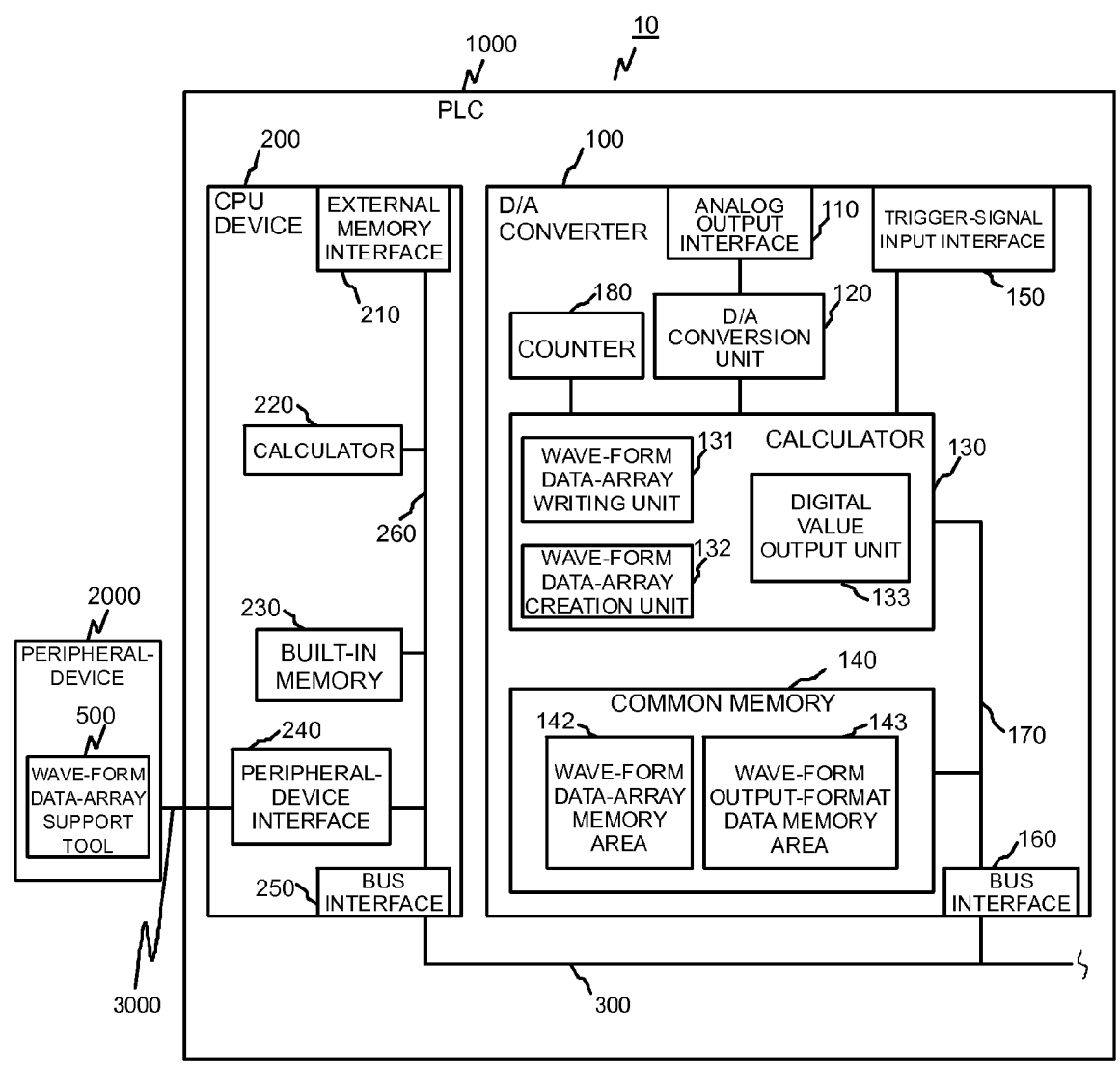
FIG. 1 is a block diagram representing a configuration of a PLC system 10 including a D/A converter 100 according to Embodiment 1.
Figure 2:
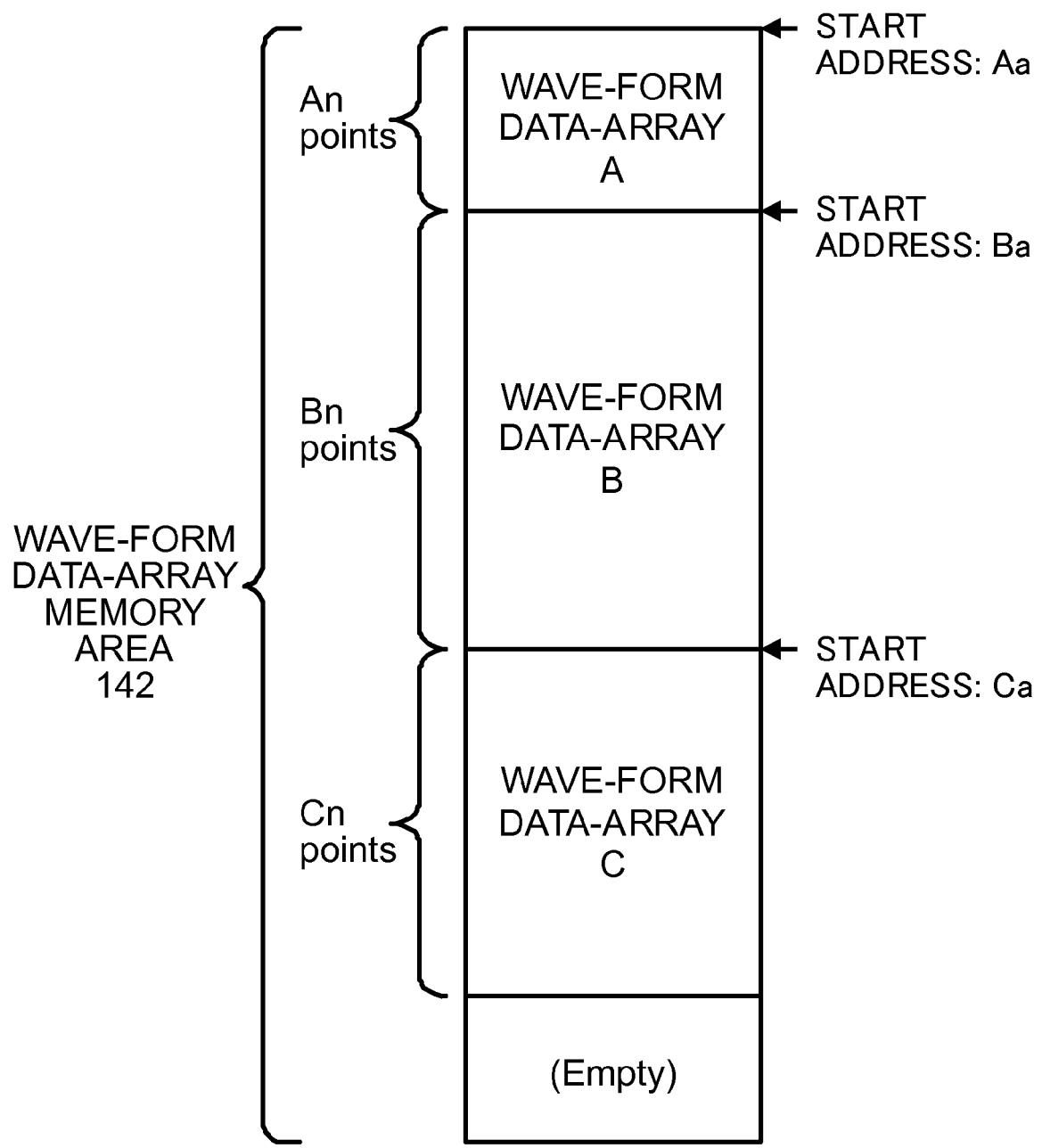
FIG. 2 is a view representing data structure of a wave-form data-array memory area 142.
Figure 3:
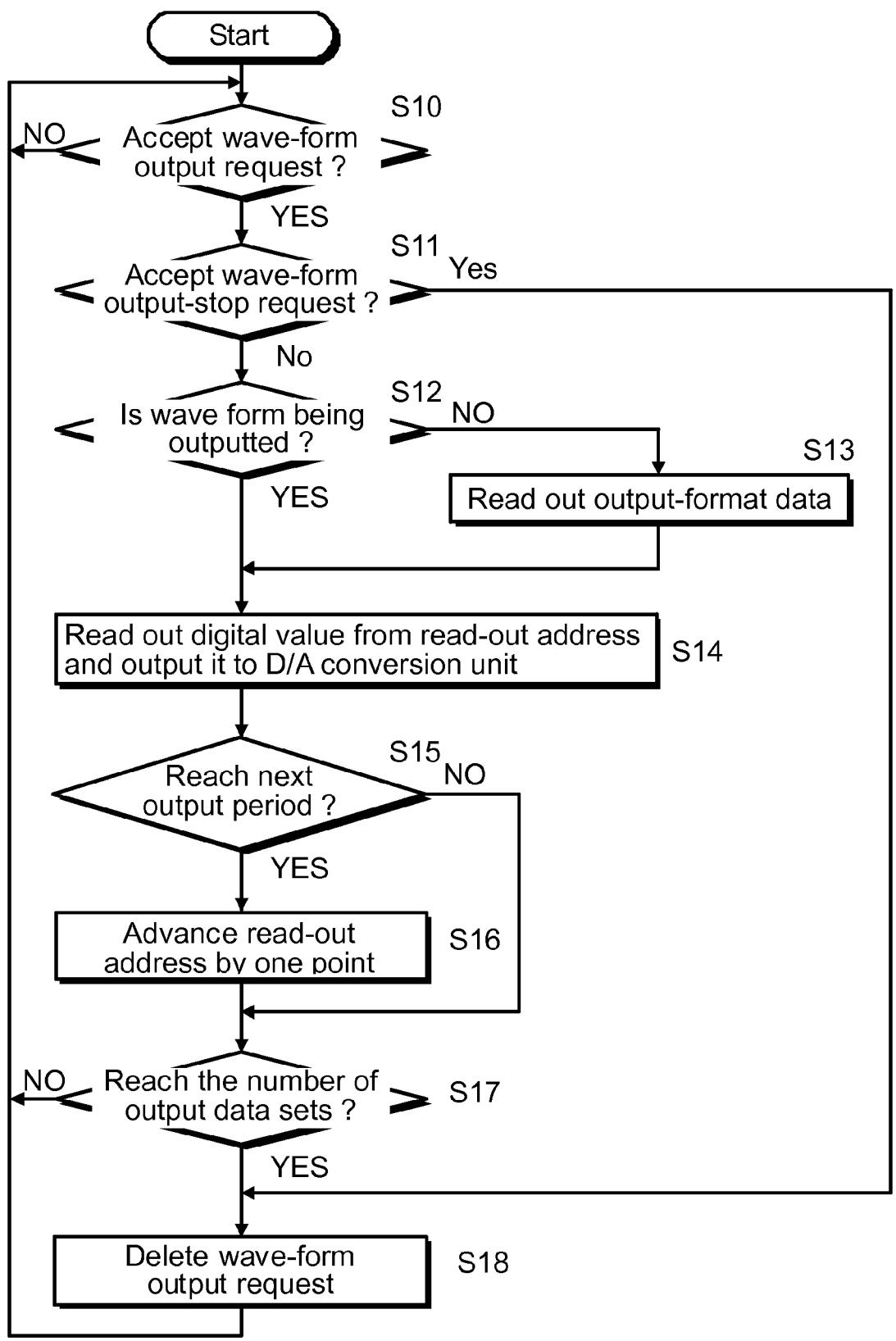
FIG. 3 is a flowchart representing operation of a digital-value output unit 133 of the D/A converter 100 according to Embodiment 1.

By referring to FIG. 1 to FIG. 3, Embodiment 1 according to the present invention is explained.

FIG. 1 is a block diagram representing a configuration of a PLC system 10 including a D/A converter according to Embodiment 1. The PLC system 10 represented in FIG. 1 is provided with a PLC 1000 and a peripheral device 2000 such as a computer. The peripheral device 2000 is provided with a wave-form data-array support tool 500. The wave-form data-array support tool 500 can be realized by installing wave-form creation software into the peripheral device 2000. The PLC 1000 and the peripheral device 2000 are connected with each other through a connection cable 3000.

The PLC 1000 is provided with at least a D/A converter 100 and a CPU device 200. The PLC 1000 may be further provided with a device which is not illustrated in the figure. The device not illustrated in the figure includes, for example, a motion controller for realizing position control of multiple axes by controlling a servo amplifier, a temperature controller for outputting a temperature control signal based on a command from the CPU device 200, or the like. Each of the devices provided in the PLC 1000 is connected to each other through an inter-device bus 300.

The CPU device 200 is provided with a calculator 220 for totally controlling the CPU device 200, an external-memory interface 210 for connecting an external memory such as a memory card, and a built-in memory 230. In the external memory or the built-in memory 230, a user program, data used for executing the user program, and execution result data of the user program are memorized. Here, the user program is a program for controlling an external device as a target controlled by the PLC 1000, which is configured of, for example, a ladder program or a C language program. The CPU device 200 is further provided with a peripheral-device interface 240 for connecting the peripheral device 2000, and a bus interface 250 for connecting the inter-device bus 300. The external-memory interface 210, the calculator 220, the built-in memory 230, the peripheral-device interface 240, and the bus interface 250 are connected each other through an internal bus 260.

The CPU device 200 performs, repeatedly for every predetermined control period, execution of the user program, reading out of the data used for executing the user program, and writing of the execution result of the user program. This control period equals to a period that the CPU device 200 executes the user program. The writing of the execution result of the user program includes operation, described later, that a digital value is written into a common memory 140 of the D/A converter 100.

The D/A converter 100 is provided with a calculator 130 for controlling the whole of the D/A converter 100, the common memory 140 into which writing can be performed by the CPU device 200, and a D/A conversion unit 120 for converting a digital value to an analog data value. The D/A converter 100 is further provided with an analog-output interface 110 for connecting an external device to be controlled by the PLC 1000, a trigger-signal-input interface 150 for connecting an external input terminal through which a trigger signal is inputted, a bus interface 160 for connecting the inter-device bus 300, and a counter 180 for outputting a counter signal for every D/A conversion period. The D/A conversion period is a value set as a period while a single digital value is converted to an analog data value.

The calculator 130, the common memory 140, and the bus interface 160 are connected to each other through an internal bus 170. The D/A conversion unit 120 is connected to the calculator 130, and the analog-output interface 110 is connected to the D/A conversion unit 120. The trigger-signal-input interface 150 is connected to the calculator 130.

The common memory 140 is provided with a wave-form data-array memory area 142 for memorizing a wave-form data array. The wave-form data array is a digital data array constituted by a plurality of digital values. FIG. 2 is a diagram representing data structure of the wave-form data-array memory area 142. The wave-form data-array memory area 142 is reserved so as to memorize a plurality of wave-form data arrays. Each of the wave-form data arrays can be composed of an arbitrary number of points. The number of points means a number of data sets. For example, one point corresponds to 16 bit or 32 bit data, which corresponds to one digital value.

The common memory 140 is provided with a wave-form output-format data memory area 143 for memorizing wave-form output-format data. The wave-form output-format data is a parameter for specifying an output format of a wave form that the D/A converter 100 outputs through the analog-output interface 110, and, in this embodiment, a start address, the number of output data sets, and an output period are specified. The start address is an address of the first digital value of the wave-form data array memorized in the wave-form data-array memory area 142. In an example of FIG. 2, the start address of "wave-form data-array A" memorized in the wave-form data-array memory area 142 is "Aa". The number of output data sets is the number of points for the wave-form data array, which corresponds to the number of the digital values constituting the wave-form data array. In the example of FIG. 2, the number of output data sets of "wave-form data-array A" is "An points". The output period is specified by a value obtained by multiplying the D/A conversion period by an integer not smaller than 1.

The calculator 130 represented in FIG. 1 is realized by, for example, a micro peripheral device or a custom LSI (ASIC) executing a system program memorized in the built-in memory or the external memory which are not illustrated in the figure. The calculator 130 is functionally provided with a wave-form data-array writing unit 131 for writing the wave-form data array into the wave-form data-array memory area 142, a wave-form data-array creation unit 132 for creating the wave-form data array based on wave-form specifying data described later, and a digital-value output unit 133 for reading out the digital value from the wave-form data-array memory area 142 and outputting this digital value to the D/A conversion unit 120.

Here, the wave-form data array is written into the wave-form data-array memory area 142 by any one of the following five methods. In a first method, the calculator 220 of the CPU device 200 creates a wave-form data array by executing the user program memorized in the built-in memory 230 or the external memory, and the wave-form data array is written into the wave-form data-array memory area 142. This method can be realized by providing the wave-form data-array memory area 142 in the common memory 140 into which writing can be directly performed by the CPU device 200.

In a second method, a user first mounts, to the external-memory interface 210 of the CPU device 200, the external memory in which a wave-form data array has been previously memorized. The CPU device 200 next requests the D/A converter 100 to read out the wave-form data array from the external memory. Next, when the wave-form data-array writing unit 131 of the D/A converter 100 accepts the request, the wave-form data array memorized in the external memory is read out through the inter-device bus 300, and then the wave-form data array is written into the wave-form data-array memory area 142.

In a third method, the user first draws a wave form by operating a mouse on the wave-form data-array support tool 500 of the external peripheral device 2000, thereby creating wave-form graphical data. Next, the wave-form data-array support tool 500 creates a wave-form data array based on the graphical wave-form data created by the user operation, and then the wave-form data array is written into the wave-form data-array memory area 142 through the CPU device 200 and the inter-device bus 300.

In a fourth method, the user first operates to memorize in the external peripheral device 2000 a CSV-format or an excel-format file in which a wave-form data array is stored. Next, the wave-form data-array support tool 500 of the external peripheral device 2000 reads out the wave-form data array from the file, and then the wave-form data array is written into the wave-form data-array memory area 142 through the CPU device 200 and the inter-device bus 300.

In a fifth method, the user first operates an external device such as the peripheral device 2000, thereby transmitting, to the wave-form data-array creation unit 132 of the D/A converter 100, data for specifying a basic wave form such as a sine-wave form, a rectangular-wave form, a triangular-wave form, and a PWM-wave form (hereinafter, referred to as "wave-form specifying data"). As the wave-form specifying data, for example, the kind of the wave form such as "sine wave", the period of the wave form, and the amplitude of the wave form are included. Next, the wave-form data-array creation unit 132 creates a wave-form data array based on the wave-form specifying data. The wave-form data-array writing unit 131 subsequently writes into the wave-form data-array memory area 142 the wave-form data array created by the wave-form data-array creation unit 132. Thereby, for example, when the PLC system 10 starts operating, output confirmation and wiring check, etc., of the D/A converter 100 can be easily performed without using the user program for the CPU device.

Here, the wave-form data array is written into the wave-form data-array memory area 142 at arbitrary timing by any one of the above five methods. At this time, an address one point after the last address of the wave-form data array written into the wave-form data-array memory area 142 immediately before new writing becomes the start address of the wave-form data array newly written into the wave-form data-array memory area 142. That is, in the example of FIG. 2, a head address "Ba" of "wave-form data array B" written, immediately after "wave-form data array A", into the wave-form data-array memory area 142 is an address one point after the last address of "wave-form data array A".

Additionally, when the wave-form data array is written into the wave-form data-array memory area 142 or thereafter, the wave-form output-format data is written into the wave-form output-format data memory area 143. At this time, the wave-form output-format data is written into the wave-form output-format data memory area 143, by means same as the one that has written the wave-form data array into the wave-form data-array memory area 142. That is, for example, when the wave-form data array is written into the wave-form data-array memory area 142 by the first method, the calculator 220 of the CPU device 200 writes the wave-form output-format data into the wave-form output-format data memory area 143.

Next, by referring to FIG. 3, operation of the digital-value output unit 133 in the embodiment is explained. FIG. 3 is a flowchart representing the operation of the digital-value output unit 133 of the D/A converter 100 in Embodiment 1. First, the digital-value output unit 133 determines whether accepting wave-form output request (Step S10). As a method of accepting the wave-form output request, for example, the following methods may be used:

- a method of accepting a custom command of the wave-form output request issued by the CPU device 200;
- a method of accepting, as the wave-form output request, a rising edge of an internal signal of the PLC 1000; and
- a method of accepting, as the wave-form output request, a rising edge of a trigger signal inputted into the trigger-signal-input interface 150.

Here, after the wave-form data array and the wave-form output-format data have been written into the wave-form data-array memory area 142 and the wave-form output-format data memory area 143, respectively, the wave-form output request is inputted into the D/A converter 100.

When the wave-form output request is not accepted in S10, the process returns to S 10, and the digital-value output unit 133 determines again whether accepting the wave-form output request. On the other hand, in S10, when the wave-form output request is accepted, the digital-value output unit 133 next determines whether accepting the wave-form output-stop request (Step S11). As a method of accepting the wave-form output-stop request, for example, the following methods may be used:

- a method of accepting a custom command of the wave-form output-stop request issued by the CPU device 200;
- a method of accepting, as the wave-form output-stop request, a falling edge of an internal signal of the PLC 1000; and
- a method of accepting, as the wave-form output-stop request, a falling edge of a trigger signal inputted into the trigger-signal-input interface 150.

Here, the case in which the wave-form output request is accepted in S10 and the wave-form output-stop request is accepted in S11 means a case in which, while outputting of each digital value configuring "wave-form data array A" to the D/A conversion unit 120 is started after the wave-form output request, for example, for "wave-form data array A" represented in FIG. 2 is accepted, the wave-form output-stop request is accepted before the outputting of the last digital value of "wave-form data array A" to the D/A conversion unit 120 is completed.

When the wave-form output-stop request is accepted in S11, the digital-value output unit 133 goes to S18. On the other hand, in S11, when the wave-form output-stop request is not accepted, the digital-value output unit 133 next determines whether the wave form is being outputted (Step S12). That is, the digital-value output unit 133 determines whether or not the current processing is the output of the first digital value of the wave-form data array.

When the wave form is not outputted in S12, because the wave-form output-format data is needed to be read out, the digital-value output unit 133 next obtains the wave-form output-format data corresponding to the current wave-form data array from the wave-form output-format data memory area 143 (Step S13), and then goes to S14. On the other hand, when the wave form is being outputted in S12, the digital-value output unit 133 directly goes to S14.

In S14, the digital-value output unit 133 reads out the digital value memorized in a read-out address of the wave-form data-array memory area 142, and outputs the digital value to the D/A conversion unit 120 (Step S14). Here, the read-out address means an address, in the wave-form data-array memory area 142, in which a digital value currently outputted to the D/A conversion unit 120 is read out. That is, the read-out address when the first digital value of the wave-form data array is outputted to the D/A conversion unit 120 is the start address described above. As described later, the read-out address is started from the first address, and then changed to the following address one by one.

Here, the digital value outputted to the D/A conversion unit 120 in S14 is converted to an analogous data value by the D/A conversion unit 120. Then, the analogous data value is outputted through the analog-output interface 110 to an external device in a form of a current value or a voltage value.

After S14, the digital-value output unit 133 determines whether to reach the next output period (Step S15). That is, the digital-value output unit 133 determines based on the counter signal from the counter 180.

In S15, when it does not reach the next output period, the digital-value output unit 133 then goes to S17. On the other hand, in S15, when it reaches the next output period, followingly the digital-value output unit 133 changes the read-out address so that the read-out address comes close to the last address by one point (Step S16), and then goes to S17.

In S17, the digital-value output unit 133 determines whether to reach the number of output data sets (Step S17). That is, the digital-value output unit 133 determines whether to have output all of the digital values configuring the wave-form data array. When it does not reach the number of the output data sets in S17, the digital-value output unit 133 returns to S10, and outputs the remaining digital values with repeating the processing from S10 to S17. On the other hand, when it reaches the number of the output data sets in S17, the digital-value output unit 133 goes to S18.

In S18, the digital-value output unit 133 deletes the wave-form output request (Step S18), and then returns to S10.

According to Embodiment 1, because the D/A conversion of the wave-form data array is started after all of the digital values configuring the wave-form data array have been written into the memory of the D/A converter 100, the wave forms can be outputted at a high speed regardless of the control period of the CPU device 200.

Moreover, according to Embodiment 1, because the D/A converter 100 determines whether the wave-form output-start request or the wave-form output-stop request is accepted for each of the D/A conversion periods, the D/A converter can respond to the complicated control that repeats the start/stop of the wave form output.

Here, the present invention is not limited to the embodiment explained in Embodiment 1, so long as the problem can be solved by the invention. For example, a wave-form data-array and wave-form output-format data may be written into the wave-form data-array memory area 142 and the wave-form output-format data memory area 143, respectively, in a method and a timing other than those explained in Embodiment 1.

Furthermore, in Embodiment 1, the start address, the number of the output data sets, and the output period are specified as the wave-form output-format data; however, it is not limited thereto. For example, in the wave-form output-format data, a tail-end address as the last address of the wave-form data array memorized in the wave-form data-array memory area 142 may be designated instead of the number of the output data sets.

In the wave-form output-format data, in addition to the head address, the number of the output data sets, and the output period, the number of time for outputting the wave form corresponding to the same wave-form data array may be designated. This will make the processing of the PLC 1000 easier as a whole when the D/A converter 100 repeatedly outputs the same wave forms.

In the wave-form output-format data, in addition to the head address, the number of the output data sets, and the output period, an analog data value outputted after outputting a wave form corresponding to one wave-form data array may be designed. This will make the output in an idle state between each of the wave forms to be designated arbitrarily when a plurality of wave forms are sequentially outputted.

The wave-form data-array memory area 142 can also be configured by a FIFO (First-In, First-Out) memory. This eliminates the need for designating the head address by the wave-form output-format data.

In Embodiment 1, the D/A converter 100 reads out the wave-form output-format data from the wave-form output-format data memory area 143; however, it is not limited thereto. For example, when the wave-form output request in S10 of FIG. 3 is accepted as a dedicated command for the wave-form output request issued by the CPU device 200, the wave-form output-format data may be obtained from an argument of the dedicated command.

In Embodiment 1, the wave-form data-array memory area 142 and the wave-form output-format data memory area 143 are provided only in the common memory 140; however, it is not limited thereto. That is, when a means other than the CPU device writes the wave-form data array and the wave-form output-format data, the data may be written into the built-in memory of the D/A converter 100 other than the common memory 140.

EXPLANATION OF REFERENCES

10 PLC system
100 D/A converter
120 D/A conversion unit
131 Wave-form data-array writing unit
132 Wave-form data-array creation unit
133 Digital-value output unit
142 Wave-form data-array memory area
143 Wave-form output-format data memory area
200 CPU device
500 Wave-form data-array support tool
1000 PLC
2000 Peripheral device

What is claimed is:

1. A digital/analog (D/A) converter comprising:
   a wave-form data-array memory for memorizing a wave-form data array configured of a plurality of digital values;
   a wave-form output-format data memory for memorizing wave-form output-format data designating a wave-form output period;
   a digital value outputter for sequentially reading out the digital values for the wave-form output period from the wave-form data-array memory and outputting the digital values; and
   a D/A converter for converting the digital values outputted for the wave-form output period from the digital value outputter into analog-data values,
   wherein the digital value outputter determines whether a wave-form output request or a wave-form output-stop request is accepted for a D/A conversion period, and when the digital value outputter determines that the wave-form output request is accepted, the digital value outputter performs the reading out and outputting of all of the digital values in the wave-form data array previously written into the wave-form data-array memory, while when the digital value outputter determines that the wave-form output-stop request is accepted, the digital value outputter stops performing the reading out and outputting of the digital values.

2. The D/A converter as recited in claim 1, wherein the wave-form data-array memory is provided in a common memory which is writable from an external CPU device, and the wave-form data array is written into the wave-form data-array memory by the CPU device.

3. The D/A converter as recited in claim 1, further comprising a wave-form data-array writer for reading out the wave-form data array configured of a plurality of digital values from an external memory and writing the read out wave-form data array into the wave-form data-array memory.

4. The D/A converter as recited in claim 1, further comprising a wave-form data-array creator for creating a wave-form data array corresponding to at least any one of a sine wave, a rectangular wave, a triangular wave, or a pulse width modulation (PWM), and writing the wave-form data array into the wave-form data-array memory.

5. The D/A converter as recited in claim 1, wherein the wave-form output-format data further designates a number of times for externally outputting a wave form corresponding to the wave-form data array, or an analog-data value outputted to the outside after outputting the wave form.

6. A peripheral device comprising:
   an inputter; and
   a wave-form data-array supporter for, based on an input from the input inputter, writing a wave-form data array configured of a plurality of digital values into the wave-form data-array memory provided on the D/A converter as recited in claim 1.

7. The peripheral device as recited in claim 6,
   wherein the wave-form data-array supporter creates graphical wave-form data based on the input, creates the wave-form data array based on the graphical wave-form data, and writes the wave-form data array into the wave-form data-array memory.

8. The peripheral device as recited in claim 6, further comprising a file-memory for memorizing a file in which a wave-form data array configured of a plurality of digital values is stored, wherein the wave-form data-array supporter reads out the wave-form data array from the file, and writes the wave-form data array into the wave-form data-array memory.

9. A programmable logic controller (PLC) comprising the D/A converter as recited in claim 1.

* * * * *